US010110152B1

(12) United States Patent
Hajati

(10) Patent No.: US 10,110,152 B1
(45) Date of Patent: Oct. 23, 2018

(54) INTEGRATED DRIVER AND CONTROLLER FOR HAPTIC ENGINE

(71) Applicant: Apple Inc., Cupertino, CA (US)

(72) Inventor: Arman Hajati, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/721,524

(22) Filed: Sep. 29, 2017

(51) Int. Cl.
| H02K 41/02 | (2006.01) |
|---|---|
| H02P 25/032 | (2016.01) |
| H02P 27/08 | (2006.01) |
| H03F 3/217 | (2006.01) |
| H03F 3/187 | (2006.01) |

(52) U.S. Cl.
CPC .......... *H02P 25/032* (2016.02); *H02P 27/085* (2013.01); *H03F 3/187* (2013.01); *H03F 3/217* (2013.01)

(58) Field of Classification Search
CPC ........... G06F 3/016; G08B 6/00; G05B 11/01; G05B 11/00; G05B 11/28; G05F 1/00; G05F 1/10; G05F 1/04; G05F 1/08; H02P 1/46; H02P 6/00; H02P 3/18; H02P 23/00; H02P 27/00; H02P 1/04; H02P 7/00; H02P 27/04; H02P 27/06; H02K 33/00; H02K 7/06; H02K 41/02; H02K 41/00
USPC ....... 318/671, 650, 677, 678, 679, 680, 681, 318/686, 687, 560, 721, 114, 115, 119, 318/135, 599, 430, 432, 437
See application file for complete search history.

(56) References Cited

U.S. PATENT DOCUMENTS

| 7,268,503 | B2 | 9/2007 | Yamasaki et al. |
|---|---|---|---|
| 9,524,624 | B2 | 12/2016 | Rank et al. |
| 9,746,923 | B2 | 8/2017 | Cruz-Hernandez et al. |
| 9,764,357 | B2 * | 9/2017 | Houston ................. B06B 1/166 |
| 9,802,225 | B2 * | 10/2017 | Houston ................... B06B 1/16 |
| 2012/0229264 | A1 | 9/2012 | Company Bosch et al. |
| 2017/0053502 | A1 | 2/2017 | Shah |

(Continued)

FOREIGN PATENT DOCUMENTS

WO        WO 98/14033        4/1998

OTHER PUBLICATIONS

Robert Nicoletti, "Audio amplifier basics: Select the best topology for your design," EE Times—Connecting the global Electronics Community, Apr. 24, 2013, 6 pages.

(Continued)

*Primary Examiner* — Antony M Paul
(74) *Attorney, Agent, or Firm* — Fish & Richardson P.C.

(57) ABSTRACT

An integrated circuit (IC) chip for driving a mass of a linear resonant actuator (LRA) using low-latency closed-loop control is described. The IC chip includes class-D amplifier circuitry configured to provide to coils of the LRA, a driving signal, which has a pulse-width modulation configured to control a position of the mass as a function of time. The driving signal has a frequency in a range of 10-100 kH, and the pulse-width modulation has a bandwidth smaller than 1 kHz. The IC chip also includes class-D controller circuitry configured to process (i) a position-monitoring signal, which (a) is received from position sensors of the LRA and (b) corresponds to the position of the mass, and (ii) a drive-monitoring signal, which relates to the driving signal, to obtain a digital driving signal. The class-D amplifier circuit is configured to amplify the digital driving signal to obtain the analog driving signal.

27 Claims, 7 Drawing Sheets

(56) References Cited

U.S. PATENT DOCUMENTS

| | | |
|---|---|---|
| 2017/0090574 A1 | 3/2017 | Baer et al. |
| 2017/0093318 A1 | 3/2017 | Ge et al. |
| 2017/0169674 A1 | 6/2017 | Macours |
| 2017/0182517 A9* | 6/2017 | Houston ................. B06B 1/166 |

OTHER PUBLICATIONS

Honda et al., "Application Note AN-1071," Class D Audio Amplifier Basics, International IOR Rectifier, 2005, 14 pages.

"High-Efficiency, Low-Noise Audio Subsystem," Maxim Innovation Delivered, 2011, 48 pages.

Analog Devices, "Microphone Preamplifier with Variable Compression and Noise Gating," Data Sheet SSM2166, 1996-2016, 14 pages.

\* cited by examiner

INTEGRATED DRIVER AND CONTROLLER FOR HAPTIC ENGINE

BACKGROUND

Technical Field

This specification relates generally to haptic engine architectures, and more specifically, to controlling a haptic engine by using a multi-channel mixed-signal chip in which driver circuitry is integrated with controller circuitry.

Background

Some mobile devices, e.g., smartphones and smart watches, include a haptic engine that is configured to provide a tactile sensation, e.g., a vibration, to a user touching or holding the mobile device. The haptic engine is a linear resonant actuator (LRA) that is mechanically coupled with an input surface of the mobile device. Drive electronics that are electrically coupled with the LRA cause the LRA to induce vibration, which is transferred to the input surface so that the vibration can be felt by a user who is touching or holding the mobile device.

Conventional haptic engines use a closed-loop architecture that includes one or more driving chips and one or more sensing chips. An example of such a conventional architecture includes a class-D audio amplifier operating in conjunction to one or more sensing chips.

Audio amplifiers are designed and optimized for high fidelity, e.g., for low total harmonic distortion (THD). Additionally, the audio amplifiers are configured to output voltage signals necessary for audio applications, and thus are optimized over the audio frequency spectrum, e.g., 20 Hz-20 kHz. Moreover, most audio applications buffer at least some samples of an audio frequency signal and, thus, incur a certain response latency. As shown in FIG. 6A, audio amplifiers typically perform a long chain of multi-rate conversion of signals, e.g., from 16 ksps to 48 ksps, and the performing of these signal conversions causes latency. For example, a typical pulse code modulation (PCM) playback chain, as shown in FIG. 6A, can cause hundreds of μs of latency on a forward signal path. A current/voltage monitoring path, not shown in FIG. 6A, experiences a similar long signal chain of multi-rate conversions to generate audio-compatible PCM output.

To further improve the efficiency of class-D audio amplifiers, the supply voltage is reduced by using class H algorithms (e.g., for adapting the boost converter voltage) or class G algorithms (e.g. for using three stable power rails) in low power modes to minimize the loss in the output stages. However, both class G and H algorithms require (i) buffering 10-20 samples, e.g., as shown for class H algorithms in FIG. 6B where the buffering causes a MEM_DEPTH delay, (ii) predicting the class-D audio amplifier's output amplitude, and (iii) responding to it. Such a sequence of operations typically adds significant delay/latency to the conventional closed-loop architecture.

One or more sensing chips are used to power and monitor one or more magnetic sensors of the LRA. The sensing chips are conventionally located on the LRA itself and are encompassed by a shield can for EMI shielding. The need for such a shield adds to (i) the LRA cost, (ii) the space requirements, and (iii) the fabrication process complexity. Additionally to the above-noted latency, which is due to the sequence of digital filters shown in FIG. 6A, delays of the sensing chips and of the channel monitoring the coil current(s) need to be perfectly matched in the controller to numerically cancel out the electromagnetic coupling between the coil current(s) and the magnetic field sensor readouts, especially at high sampling frequencies.

SUMMARY

This specification describes a closed-loop (CL) controlled haptic engine architecture in which driver circuitry is integrated with controller circuitry. In this manner, an integrated multi-channel mixed-signal chip that is customized for CL-controlled haptics (also referred to as a haptics driver integrated circuit (IC) chip) can be used to replace the current multi-chip solution.

In general, one innovative aspect of the subject matter described in this specification can be embodied in haptics driver IC chips. A haptic driver IC chip is an IC chip for driving a mass of a linear resonant actuator using low-latency closed-loop control, the IC chip including: an output driving port to couple the IC circuit with one or more coils of the LRA; class-D amplifier circuitry configured to provide, through the output driving port to the one or more coils of the LRA, an analog driving signal, which has a pulse-width modulation configured to control a position of the mass as a function of time; an input sensing port to couple the IC circuit with one or more position sensors of the LRA; and class-D controller circuitry programmable to (a) process at least (i) a digital position-monitoring signal relating to position-monitoring information, which is received through the input sensing port from the one or more position sensors of the LRA and corresponds to the mass position, and (ii) a digital drive-monitoring signal relating to the analog driving signal, to obtain a digital driving signal, and (b) provide the digital driving signal to the class-D amplifier circuitry. The class-D amplifier circuit is configured to amplify the digital driving signal to obtain the analog driving signal. Other embodiments of this aspect include corresponding computer systems, apparatus, and computer programs recorded on one or more computer storage devices, each configured to perform the actions of the foregoing techniques. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. In particular, one embodiment includes all the following features in combination.

In some embodiments, the analog driving signal can have a frequency larger than 10 kHz and smaller than 100 kHz, and the pulse-width modulation has a haptic bandwidth. Here, the digital driving signal has a frequency that is smaller than the frequency of the analog driving signal. For example, the haptic bandwidth can be smaller than 1000 Hz.

In some embodiments, the haptic driver IC chip can include analog front-end (AFE) circuitry configured to receive an analog driving-monitoring signal that has been measured at the output driving port; digitize the analog driving-monitoring signal to obtain the digital driving-monitoring signal; and provide the digital driving-monitoring signal to the class-D controller circuitry. The AFE circuitry can be configured to provide an analog current signal to the one or more position sensors of the LRA; receive, through the input sensing port from the one or more position sensors of the LRA, an analog position-monitoring signal; digitize the analog position-monitoring signal to obtain the digital position-monitoring signal; and provide the digital position-monitoring signal to the class-D controller circuitry. The AFE circuitry can include signal-conditioning circuitry configured to perform one or more of filtering, offsetting and pre-amplifying of each of the received analog signals; and at least one analog-to-digital converter (ADC) configured to perform the digitizing of the conditioned analog signals. For instance, the ADC can be a multi-channel sigma-delta ADC or a successive approximation register (SAR) ADC with MUX.

In some embodiments, as part of processing the at least the digital position-monitoring signal and the digital drive-monitoring signal, the class-D controller circuitry can be programmable to estimate a position of the mass as a function of time, and then use at least the estimated mass position to obtain the digital driving signal.

In some embodiments, the class-D controller circuitry is programmable to obtain a b-EMF signal induced in the one or more coils of the LRA as corresponding to off-cycle values of the digital drive-monitoring signal; and estimate a velocity of the mass as a function of time based on the b-EMF signal. In this manner, as part of processing the at least the digital position-monitoring signal and the digital drive-monitoring signal, the class-D controller circuitry is programmable to estimate a position of the mass as a function of time, and then use at least the estimated mass position and the estimated mass velocity to obtain the digital driving signal.

In some embodiments, the haptic driver IC chip can include (A) an input driving port to couple the IC circuit with a host controller; (B) a digital controller that includes a programmable processor including the class-D controller circuitry, and power controller circuitry that is different from the class-D controller circuitry. The power controller circuitry is programmable to process at least the digital drive-monitoring signal and a digital desired-position signal, which is received through the input driving port from the host controller and represents a desired position of the mass, to obtain a digital desired-boost signal; and delay the digital desired-position signal. The class-D controller circuitry is programmable to process, along with the digital position-monitoring signal and the digital drive-monitoring signal, a delayed instance of the digital desired-position signal to obtain the digital driving signal; and provide the digital driving signal to a class-D modulator-stage of the class-D amplifier circuitry. The digital controller further includes boost converter controller circuitry that is different from the digital controller and is configured to process at least the digital desired-boost signal to obtain a digital boost-control signal. The haptic driver IC chip can include (C) boost converter circuitry configured to obtain an analog boost signal based on the digital boost-control signal, and provide the analog boost signal to a class-D power-stage of the class-D amplifier circuitry.

For these embodiments, the power controller circuitry is programmable to process at least the digital desired-position signal to obtain a digital noise-gating signal, and provide the digital noise-gating signal to the class-D power-stage. Further for these embodiments, the haptic driver IC chip can include (D) an output sensing port to couple the IC circuit with the one or more position sensors of the LRA. Here, the power controller circuitry is programmable to process at least the digital desired-position signal to obtain a digital sensor-activate signal configured to cause the one or more position sensors of the LRA to transition from an active state to a passive state, or from the passive state to the active state.

In some embodiments, the AFE circuitry can include current source circuitry configured to produce, or stop producing, a current signal based on the digital sensor-activate signal, so the AFE circuitry can selectively provide, through the output sensing port the current signal to the one or more position sensors of the LRA.

In some embodiments, to obtain the digital driving signal, the class-D controller circuitry is programmable to process, along with the digital position-monitoring signal and the digital drive-monitoring signal, (i) a digital current monitoring signal relating to an analog current signal, which is provided by the class-D amplifier circuitry through the output driving port to the one or more coils of the LRA, and (ii) a digital temperature-monitoring signal relating to temperature-monitoring information, which is received through the input sensing port from the one or more position sensors of the LRA and corresponds to a temperature of the respective sensor as a function of time.

In some embodiments, the haptic driver IC chip can include a plurality of instances of the output driving port to couple the IC circuit with corresponding coils of the LRA; a plurality of instances of the class-D amplifier circuitry configured to provide, through respective instances of the output driving port to the corresponding coils of the LRA, respective instances of the analog driving signal, which have respective instances of the pulse-width modulation configured to control the position of the mass as a function of time; and a plurality of instances of the input sensing port to couple the IC circuit with corresponding position sensors of the LRA. Here, the class-D controller circuitry is programmable to process at least (i) the plurality of instances of the digital position-monitoring signal relating to position-monitoring information, which are received through the respective instances of the input sensing port from the corresponding position sensors of the LRA and correspond to the mass position, and (ii) the plurality of instances of the digital drive-monitoring signal relating to respective instances of the analog driving signal, to obtain a plurality of instances of the digital driving signal; and provide the instances of the digital driving signal to the respective instances of the class-D amplifier circuitry. Moreover, the instances of the class-D amplifier circuit are configured to amplify the respective instances of the digital driving signal to obtain the corresponding instances of the analog driving signal.

For these embodiments, the AFE circuitry can be configured to receive a plurality of instances of the analog driving-monitoring signal that have been tapped from respective instances of the analog driving signal at the corresponding instances of the output driving port, and digitize them to obtain the respective instances of the digital driving-monitoring signal; receive a plurality of instances of the analog position-monitoring signal through the corresponding instances of the input sensing port from the respective position sensors of the LRA, and digitize them to obtain the respective instances of the digital position-monitoring signal; and provide the plurality of instances of the digital position-monitoring signal and the plurality of instances of the digital driving-monitoring signal to the class-D controller circuitry.

Further for these embodiments, the AFE circuitry can include a plurality of instances of the signal conditioning circuitry, each instance corresponding to a respective received analog signal; a multiplexer configured to multiplex the received analog signals; and the ADC configured to perform the digitizing of the multiplexed analog signals.

Further for these embodiments, the class-D controller circuitry is programmable to obtain a plurality of instances of the b-EMF signal induced in respective coils of the LRA as corresponding to off-cycle values of the respective instances of the digital drive-monitoring signal; and estimate the velocity of the mass as a function of time based on the instances of the b-EMF signal. In some cases, first and second instances of the class-D amplifier circuitry are configured to provide respective first and second instances of the analog driving signal on a one-at-a-time basis, and the class-D controller circuitry is programmable to obtain (i) a first instance of the b-EMF signal induced in the first coil when the first instance of the analog driving signal is not provided to the first coil while the second instance of the analog driving signal is provided to the second coil, and (ii) a second instance of the b-EMF signal induced in the second coil when the second instance of the analog driving signal is not provided to the second coil while the first instance of the analog driving signal is provided to the first coil. Moreover, as part of processing at least the plurality of instances of the digital position-monitoring signal and the plurality of instances of the digital drive-monitoring signal, the class-D controller circuitry is programmable to estimate a position of the mass as a function of time, and then use at least the estimated mass position and the estimated mass velocity to obtain the plurality of instances of the digital driving signal.

In any one of the foregoing embodiments of the haptic driver IC chip, the class-D controller circuitry and the power controller circuitry can be configured as low power programmable processors, as programmable gate arrays or a combination of a low power programmable processor and a programmable gate array. In any one of the foregoing embodiments of the haptic driver IC chip, the class-D controller circuitry and the power controller circuitry can include memory encoding instructions that, when executed by the class-D controller circuitry and/or the power controller circuitry, cause the class-D controller circuitry and/or the power controller circuitry to process the received digital signals using one or more of an LRA model, a thermal model and a Kalman filter.

Another innovative aspect of the subject matter described in this specification can be embodied in a haptic system-in-package (SiP) including a printed-circuit board (PCB); any one of the foregoing embodiments of the haptic driver IC chip; and an LRA. Each of the haptic driver IC chip and the LRA is mounted on the PCB.

Another innovative aspect of the subject matter described in this specification can be embodied in a haptic system including a printed-circuit board (PCB); any one of the foregoing embodiments of the haptic driver IC chip mounted on the PCB; and an LRA that includes a frame. Here, the haptic driver IC chip and the PCB are either encompassed by the frame or disposed externally to the frame.

Another innovative aspect of the subject matter described in this specification can be embodied in a host device including the foregoing haptic SiP or the foregoing haptic system; and the foregoing host controller. In some embodiments, the host device can be one of a smartphone, a tablet computer, a laptop computer, or a wearable device.

The subject matter described in this specification can be implemented in particular embodiments so as to realize one or more of the following advantages. For instance, the disclosed haptics driver IC chip removes some components of a conventional CL haptics architecture, which in turn (i) results in reductions of cost, circuitry area, latency, and power usage, and (ii) causes improved performance of the LRA of the CL haptics architecture.

For example, the disclosed technologies enable closing the loop, with respect to position of the LRA's mass, at high bandwidth and low latency within the class-D amplifier circuitry. As another example, the power controller of the disclosed haptics driver IC chip can control the boost converter circuitry (e.g., based on class H or G algorithms), and predict the noise-gate for the class-D power stage of the class-D amplifier circuitry. As yet another example, the disclosed technologies enable measuring back electromotive force (b-EMF) signals directly during OFF phases of the pulse-width modulation (PWM) driving signals produced by the class-D amplifier circuitry of the disclosed haptics driver IC chip.

Further, the disclosed haptics driver IC chip can have a frequency bandwidth that is optimized based on the LRA's frequency range, e.g., 50-500 Hz, instead of the audio range, e.g., 20 Hz-20 kHz, characteristic to an audio amplifier used by conventional closed-loop haptics. Furthermore, the disclosed haptics driver IC chip can be configured to operate in MIMO/MultiPhase mode in which it accommodates additional driver/sense channels for estimating and actively cancelling higher modes of motion. Additionally, Hall-effect sensors, current sources, filters and ADCs can be integrated as part of analog front-end circuitry of the disclosed haptics driver IC chip.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
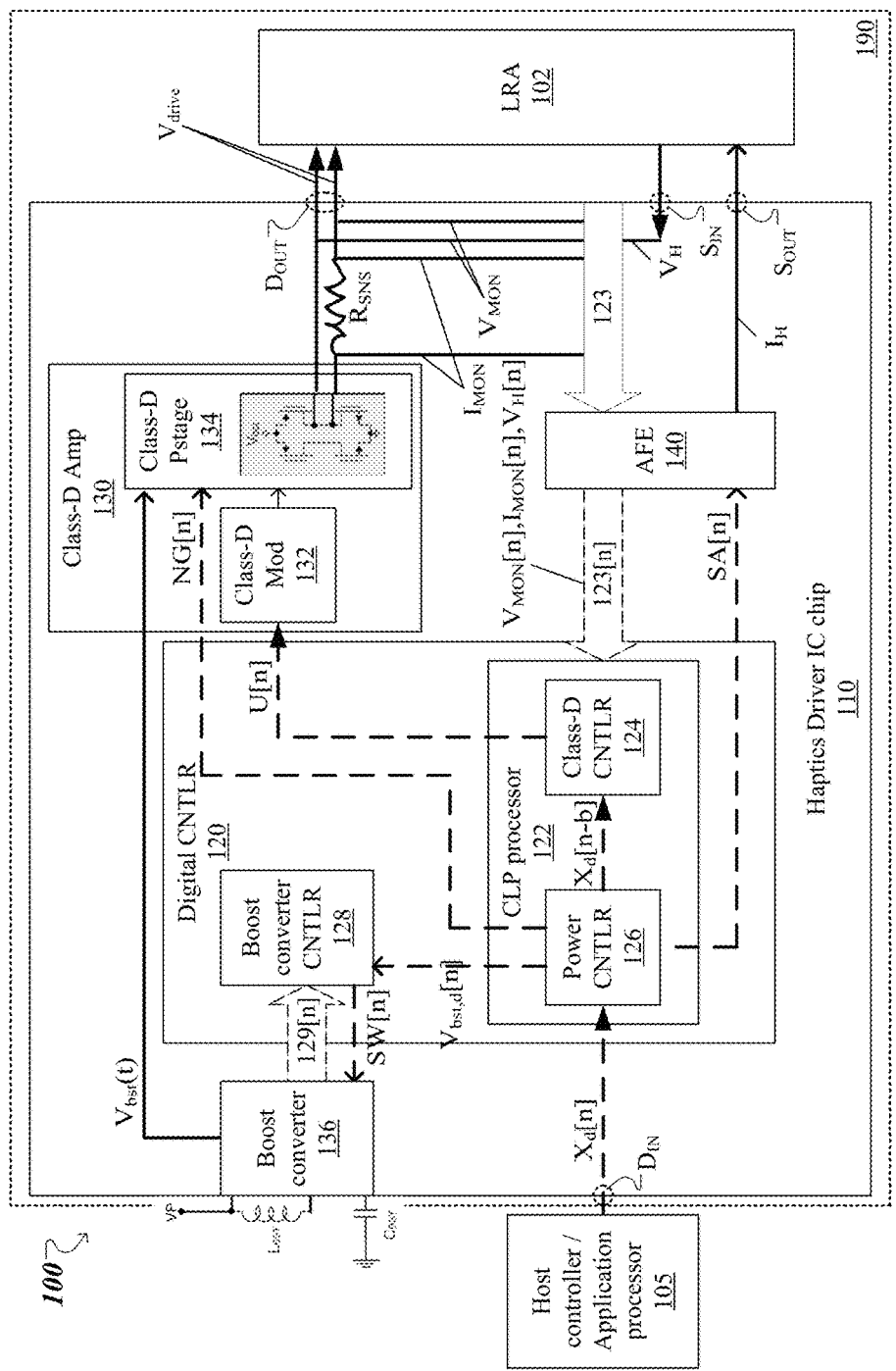
FIG. 1A shows an example of an integrated mixed-signal chip customized for haptics.

FIG. 1A shows a CL-controlled haptic engine architecture 100 that uses an example of a haptics driver IC chip 110. The haptics driver IC chip 110 is an integrated mixed-signal chip customized for haptics. The CL-controlled haptic engine architecture 100 includes, in addition to the haptics driver IC chip 110, an LRA 102 and a host controller 105 configured to use the haptics driver IC chip to drive the LRA in a desired manner.

The LRA 102 suitably includes a mass, a magnetic field source to produce a magnetic field, and one or more coils each of the coils to be driven with a respective driving current signal. In this manner, a Lorentz force induced by an interaction between the magnetic field and the driving current signals cause motion of the mass, e.g., vibration, along a driving direction, e.g., the x-axis of a Cartesian coordinate system of the LRA 102. Here, the driving current signals are provided to the one or more coils included in the LRA 102 by the haptics driver IC chip 110. Also, the LRA 102 suitably includes one or more position sensors that produce respective position-monitoring signals corresponding to a position of the mass as a function of time, at least along the direction of motion X(t). Moreover, particular combinations of position-monitoring signals suitably correspond to (i) translation modes of the mass' motion along directions orthogonal to the driving direction, e.g., Z(t)-modes along the z-axis, Y(t)-modes along the y-axis, and/or (ii) yaw modes of the mass' motion, e.g., corresponding to Φ(t)-rotations about the z-axis in the (x,y)-plane. The one or more position sensors included in the LRA 102 can be Hall-effect sensors or any other kind of magnetic field sensors. In the example illustrated in FIG. 1A, the position sensors included in the LRA 102 are powered by sensor-current signals provided by the haptics driver IC chip 110.

In some implementations, both the haptics driver IC chip 110 and the LRA 100 are mounted on a printed-circuit board (PCB) 109 as part of a haptic system-in-package (SiP). In some implementations, the haptics driver IC chip 110 and the PCB 190 on which it is mounted can be disposed inside of, or attached externally to, a frame of the LRA 100. In some implementations, the haptics driver IC chip 110, the LRA 102 and the host controller 105 can be part of a host device. Note that the host controller 105 is an application processor of the host device and can be mounted on the PCB 190 or on another substrate included on the host device. The host device can be a mobile computing device, e.g., a smartphone, a tablet computer, a laptop computer, etc., and/or a wearable device, e.g., a watch, a wristband, etc.

In the example illustrated in FIG. 1A, the haptics driver IC chip 110 includes class-D amplifier circuitry 130. Further, the haptics driver IC chip 110 includes boost converter circuitry 136 and analog front-end (AFE) circuitry 140 each coupled with the class-D amplifier circuitry 130. Furthermore, the haptics driver IC chip 110 includes a digital controller 120 coupled with each of the class-D amplifier circuitry 130, the boost converter circuitry 136 and the AFE circuitry 140. The digital controller 120 is a programmable digital controller that includes (i) boost converter controller circuitry 128 coupled with the boost converter circuitry 136, and (ii) a custom low-power (CLP) processor 122 coupled with the boost converter controller circuitry and both the class-D amplifier circuitry 130 and the AFE circuitry 140.

Further in the example illustrated in FIG. 1A, the CLP processor 122 includes (i) class-D controller circuitry 124 coupled with the AFE circuitry 140 and the class-D amplifier circuitry 130, and (ii) power controller circuitry 126 coupled with the class-D controller circuitry and with each of the boost converter controller circuitry 128, AFE circuitry, and the class-D amplifier circuitry. Each of the foregoing circuits of the haptics driver IC chip 110 includes a corresponding set of logical gates and registers formed on a silicon substrate in accordance with CMOS technologies, for instance. The logical gates are programed to execute operations in accordance with software and/or firmware instructions stored in memory (not explicitly shown in FIG. 1A) and based on parameters stored in the registers. The memory storing the instructions can be part of the digital controller 120, or can be external to the digital controller but still be part of the haptics driver IC chip 110. In addition to storing the foregoing instructions, the memory suitably buffers at least portions of digital signals produced by the power controller 126, received from the host controller 105, etc.

Further, the haptics driver IC chip 110 has various ports through which at least some of the foregoing circuits communicate with, i.e., receive/transmit signals from/to, the host controller 105 and the LRA 102. For example, the class-D amplifier circuitry 130 transmits analog signals to the coils inside the LRA 102 through an output analog port $D_{OUT}$, and the AFE circuitry 140 transmits analog signals to the position sensors inside the LRA through another output analog port $S_{OUT}$. As another example, the AFE circuitry 140 receives analog signals from the position sensors inside the LRA 102 through an input analog port $S_{IN}$, and the CLP processor 122 receives digital signals from the host controller 105 through an input digital port $D_{IN}$. In some implementations, when the LRA 102 produces digital position-monitoring signals, the CLP processor 122 receives these signals directly from the LRA through another input digital port $S_{IN}$.

Furthermore, the haptics driver IC chip 110 also includes various buses through which analog signals or digital signals are transmitted on the haptics driver IC chip to at least some of the foregoing circuits. For instance, the AFE circuitry 140 receives analog signals through an analog bus 123, and transmits digital signals through a digital bus 123[n].

The class-D amplifier circuitry 130 includes a class-D modulator stage 132 and a class-D power stage 134 (also referred to as output stage.) The class-D amplifier circuitry 130 produces an analog driving signal $V_{drive}(t)$, as described below, and transmits it to one or more of the coils of the LRA 102 through the output analog port $D_{OUT}$. Note that the analog driving signal $V_{drive}(t)$ is produced as a train of pulses, where the width of the pulses is modulated by a modulation configured to control a position of the mass of the LRA 102 as a function of time, e.g., X(t). Here, a frequency of the pulses of the analog driving signal $V_{drive}(t)$ can be between 10 kHz and 100 kHz, while the modulation that modulates the width of the pulses has a haptic bandwidth that is smaller than 1 kHz. For example, in most cases the haptic bandwidth is up to 500 Hz.

In general, output linearity is not as important for experiencing haptics as it is for experiencing high fidelity sound. Moreover, a high fidelity linear response can be achieved even with a highly nonlinear driver in a closed-loop controlled system due to the feedback loop. As will be described next in connection with FIGS. 1A-1B, the closed-loop controlled system 100 is operated using a low-latency, sample-by-sample real-time approach. As such, instead of decimation down to audio PCM standard sampling rates (44.1 kHz or 48 kHz), the disclosed closed-loop calculation can be performed at much higher sampling rate to reduce the latency.

To monitor the analog driving signal $V_{drive}(t)$ and the corresponding driving current established in the one or more of the coils of the LRA 102, the former is measured at the output analog port $D_{OUT}$ as an analog driving-monitoring signal $V_{MON}(t)$, and the latter is another driving-monitoring signal $I_{MON}(t)$ measured as the ratio of the voltage across a sensing resistor $R_{SNS}$ and the value of $R_{SNS}$. In this manner, the AFE circuitry 140 receives, through the analog bus 123, the analog driving-monitoring signals $V_{MON}(t)$ and $I_{MON}(t)$, and digitizes them to obtain corresponding digital driving-monitoring signals $V_{MON}[n]$ and $I_{MON}[n]$. Additionally, the AFE circuitry 140 receives, through the analog bus 123, one or more analog position-monitoring signals $V_H(t)$ from corresponding position sensors of the LRA 102, and digitizes them to obtain one or more digital position-monitoring signals $V_H[n]$. The AFE circuitry 140 transmits the obtained digital position-monitoring signals $V_H[n]$, and digital driving-monitoring signals $V_{MON}[n]$ and $I_{MON}[n]$ to the class-D controller circuitry 124 for processing. Examples of ways to implement the AFE circuitry 140 are described below in connection with FIG. 4.

Figure 1B:
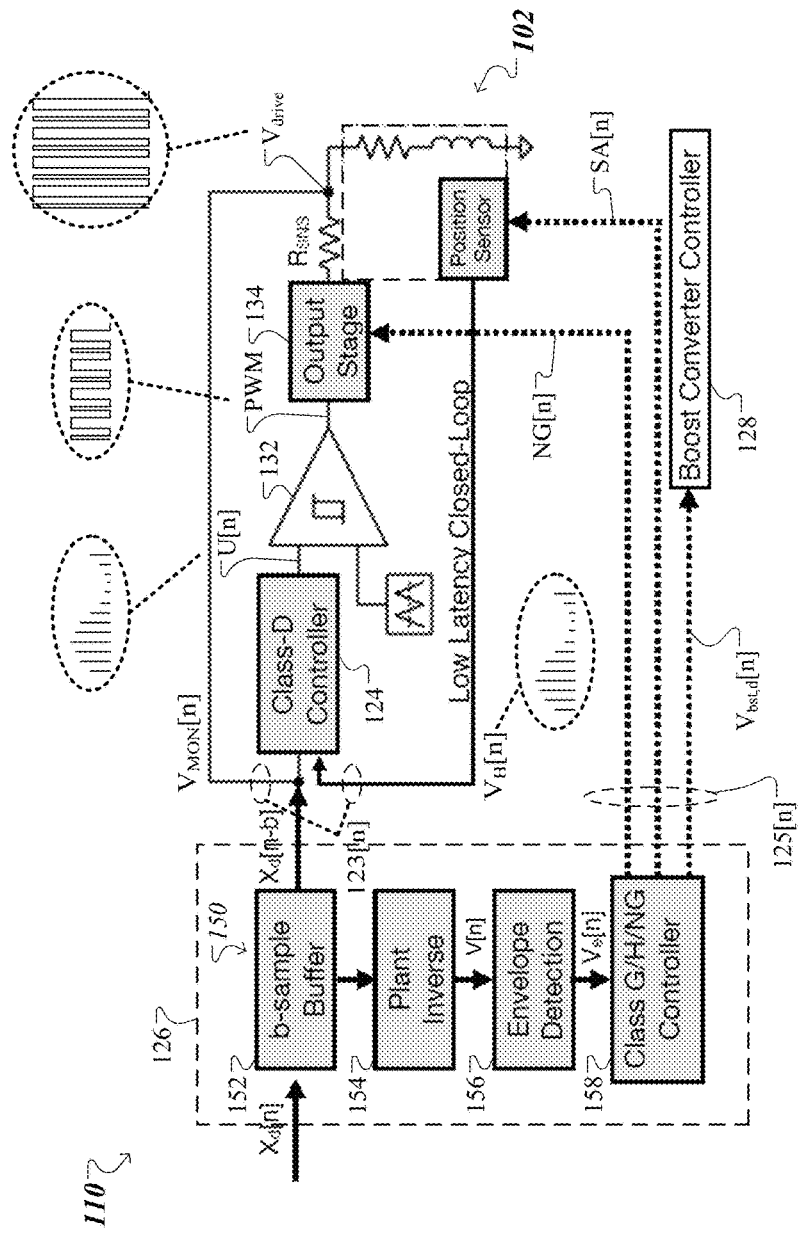
FIG. 1B shows aspects of controlled-loop operation of the integrated mixed-signal chip of FIG. 1A.

Referring now to both FIGS. 1A and 1B, the class-D controller circuitry 124 processes at least (i) a digital position-monitoring signal $V_H[n]$, which corresponds to the mass position X(t), and (ii) the digital drive-monitoring signal $V_{MON}[n]$ to obtain a digital driving signal U[n]. For instance, as part of processing the digital signals $V_H[n]$ and $V_{MON}[n]$, the class-D controller circuitry is programmable to estimate a position of the mass as a function of time, e.g., $X_{est}[n]$, and then use at least the estimated mass position to obtain the digital driving signal U[n]. Note that a frequency of the digital driving signal U[n] is smaller than the frequency of the analog driving signal $V_{drive}(t)$, and it is typically determined by a clock rate of the class-D controller circuitry 124.

Moreover, the class-D controller circuitry 124 transmits the digital driving signal (U[n]) to the class-D modulator stage 132 of the class-D amplifier circuit 130. The class-D modulator stage 132 produces a PWM signal by comparing the digital driving signal (U[n]) with a reference triangular signal, and the class-D power stage 134 amplifies the PWM signal to produce the analog driving signal $V_{drive}(t)$.

In this manner, the feedback loop of the CL-controlled haptic engine architecture 100 is suitably closed within the haptics driver IC chip 110, at high bandwidth and low latency, at its most inner loop. For the example illustrated in FIGS. 1A-1B, the most-inner loop of the haptics driver IC chip 110 is around the class-D modulator stage 132 of the class-D amplifier circuit 130. For the implementation illustrated in FIG. 1B, the feedback loop is closed around the class-D modulator stage 132 in motion-tracking mode. Here, the motion-tracking mode uses outputs of a position sensor of the LRA 102 to track either position of the mass of the LRA, or velocity of the mass, or both.

Moreover, the feedback loop around the class-D modulator stage 132 can be closed in various other modes. In some implementations, the feedback loop is suitably closed around the class-D modulator stage 132 in voltage mode. The voltage mode can be used for open loop calibration and characterization. In some implementations, the feedback loop is suitably closed around the class-D modulator stage 132 in current mode.

Alternatively, the feedback loop can be closed around the class-D modulator stage 132 in one or more power-saving modes. A first example of a power-saving mode involves closing the feedback loop around the class-D modulator stage 132 in resonance-tracking mode (also called synthesis-based). A second example of a power-saving mode involves closing the feedback loop around the class-D modulator stage 132 based on an input signal and/or an output signal, also referred to as noise-gating signal, as described below.

As the haptics closed-loop, i.e., the feedback loop operated in motion-tracking mode as shown in FIG. 1B, can predict power budget requirements based on incoming commands, e.g. a digital desired position signal $X_d[n]$, received from the host controller 105, the boost converter controller circuitry 128 suitably controls the supply voltage of the class-D amplifier circuitry 130, e.g., by properly setting the boost converter circuitry 136 or appropriate charge pump circuitry. While such controlling may add to the haptic playback latency, it does not add to the closed-loop latency, as described below.

For instance, the power controller circuitry 126 is programmable to perform a process 150 for predicting a power budget for the haptics driver IC chip 110. At 152, the power controller circuitry 126 buffers a number "b" of samples of the digital desired position signal $X_d[n]$. Here, the number of buffered samples can be b=10, 20, 50, 100, 200, 500, 1000 or another number of values. At 154, the power controller circuitry 126 performs a plant inverse algorithm to estimate a driving signal V[n] necessary to cause the mass of the LRA 102 to move in accordance with the digital desired position signal $X_d[n]$. At 156, the power controller circuitry 126 performs an envelope detection algorithm to estimate an envelope of the estimated driving signal V[n]. At 158, the power controller circuitry 126 performs one or more of a class G algorithm, a class H algorithm, and a noise-gating algorithm.

As a first example of operations performed at 158, the power controller circuitry 126 processes, as part of a class H algorithm, at least the digital drive-monitoring signal $V_{MON}[n]$ and the buffered digital desired-position signal $X_d[n]$ to produce a digital desired-boost signal $V_{bst,d}[n]$. The boost-converter controller circuitry 128 receives the digital desired-boost signal $V_{bst,d}[n]$ and processes it to produce a digital boost-control signal SW[n]. As shown in FIG. 1A, the boost converter controller circuitry 128 uses the digital boost-control signal SW[n] and one or more monitoring signals, which are received through another digital buffer 129[n], to control the boost converter circuitry 136. The boost-converter circuitry 136 produces an analog boost signal $V_{bst}(t)$, based on the digital boost-control signal SW[n], and transmits the analog boost signal $V_{bst}(t)$ to the class-D power-stage 134 of the class-D amplifier circuitry 130.

Referring again to block 152 of process 150, the power controller circuitry 126 transmits, to the class-D controller circuitry 124, an instance of the digital desired position signal $X_d[n-b]$, which is delayed by b samples relative to the instance of the digital desired position signal $X_d[n]$ that is currently being processed by the power controller circuitry. As such, the class-D controller circuitry 124 suitably uses the delayed digital desired position signal $X_d[n-b]$, along with the digital position-monitoring signal $V_H[n]$ and the digital drive-monitoring signal $V_{MON}[n]$, to obtain the digital driving signal U[n].

Figure 6A:
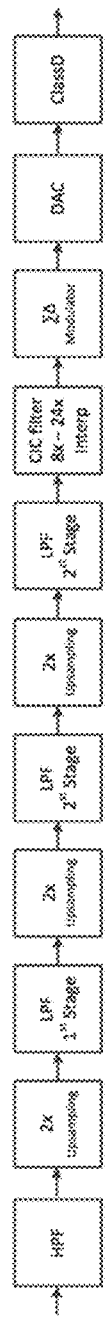
FIGS. 6A-6B show aspects of conventional techniques for implementing a closed-loop architecture for haptics.
Figure 6B:
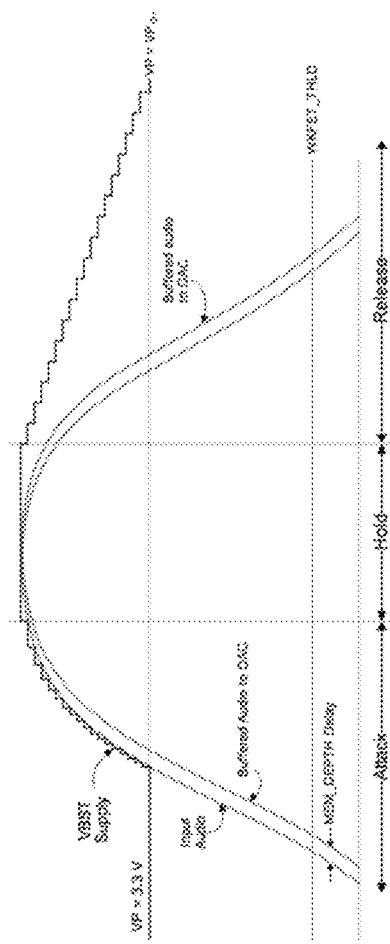

As future amplitudes of $V_{BST}$ are buffered by the power controller circuitry 126 based on the digital desired position signal $X_d[n]$ received from the host controller 105, this high latency buffering occurs for the boost controller feedback loop, while the feedback loop of the class-D modulator stage 132 can have low latency. In contrast, a conventional boost-controller feedback loop uses the amplified output voltage $V_{drive}(t)$ to estimate the $V_{BST}$ amplitudes, as shown in FIG. 6B.

Referring again to FIGS. 1A-1B, as another example of operations performed at 158, the power controller circuitry 126 processes, as part of class G/NG algorithms, at least the digital desired-position signal $X_d[n]$ to produce a digital noise gating signal NG[n], and then provides the digital noise gating signal to the class-D power-stage 134 of the class-D amplifier circuitry 130. As such, the power controller circuitry 126 can monitor the incoming commands and act as a Noise Gate to either (i) turn off or control the class-D power-stage 134 of the class-D amplifier circuitry 130, and/or I/V-monitoring ADCs of the AFE circuitry 140, and (ii) prevent battery brownouts (e.g., changes in $V_P$) for the boost-converter circuitry 136.

As yet another example of operations performed at 158, the power controller circuitry 126 processes at least the digital desired-position signal $X_d[n]$ to produce a digital sensor-activate signal (e.g., SA[n]) configured to cause the one or more position sensors of the LRA 102 to transition from an active state to a passive state, or from the passive state to the active state. As described in detail below in connection with FIG. 4, the AFE circuitry 140 includes one or more instances of current source circuitry configured to produce, or stop producing, a current signal $I_H(t)$, so the AFE circuitry can selectively provide, through the output sensing port Sour, the current signal to the one or more position sensors of the LRA 102. As such, the power controller circuitry 126 can monitor the incoming commands and act as a sensing-current gate to turn off or on at least some of the position sensors of the LRA 102.

As shown in FIG. 1B, the power control signals $V_{bst,d}[n]$, NG[n], and SA[n] are transmitted by the power controller circuitry 126 through a multi-path digital buffer 125[$n$].

Note that although the haptics driver IC chip 110 has been illustrated in FIGS. 1A-1B to have a single instance of the class-D amplifier circuitry 130, a haptics driver IC chip can be fabricated, in accordance with the disclosed technologies, to include two or more instances of the class-D amplifier circuitry, as described below. In this manner, the LRA 102 can be implemented in a multi-phase configuration, in which each of two or more coils of the LRA are to be driven using respective analog driving signals that may be from each other.

Figure 2:
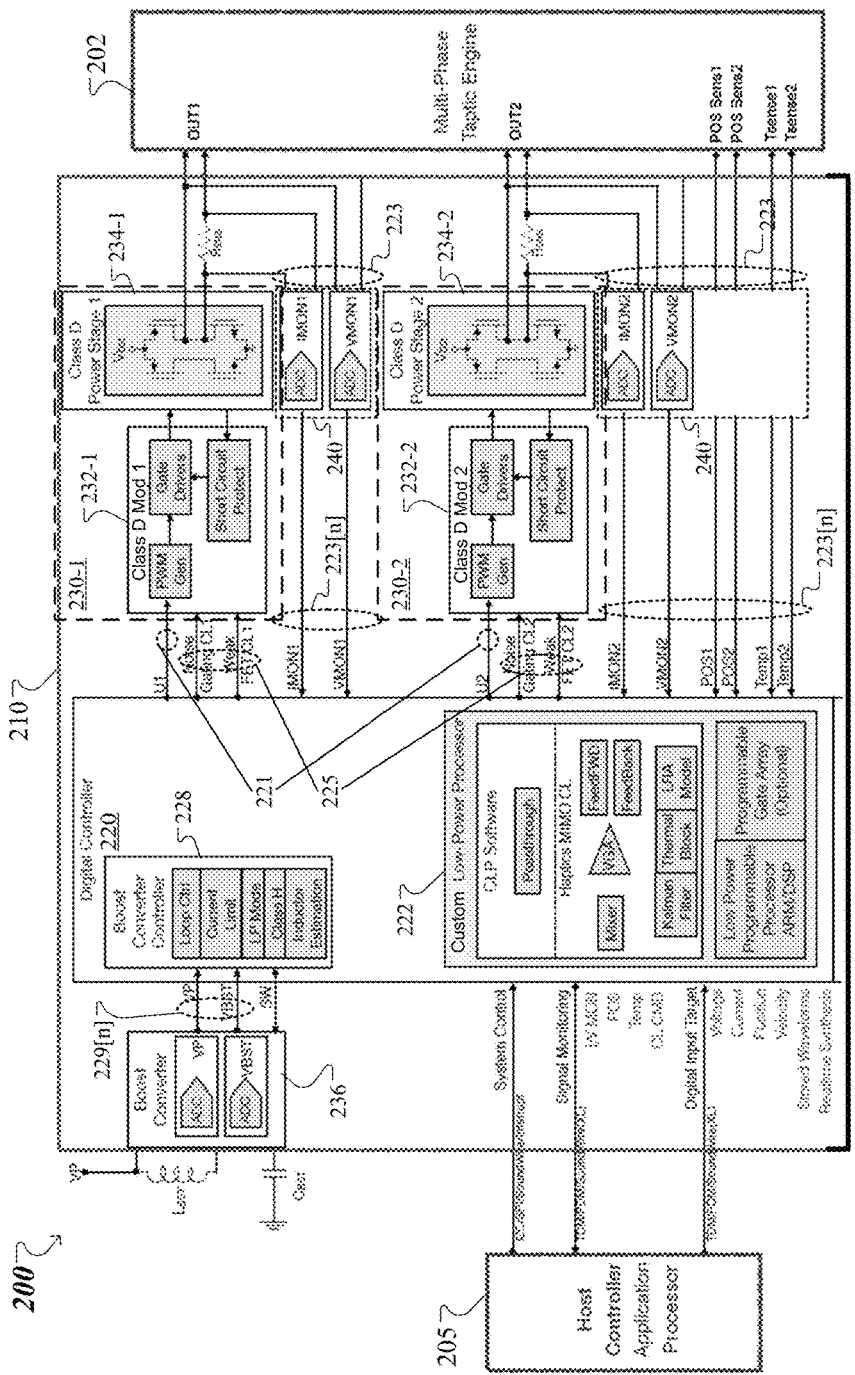
FIG. 2 shows another example of an integrated mixed-signal chip customized for haptics.

FIG. 2 shows another CL-controlled haptic engine architecture 200 that uses another example of haptics driver IC chip 210. The haptics driver IC chip 210 is an integrated mixed-signal chip customized for haptics. The CL-controlled haptic engine architecture 200 includes, in addition to the haptics driver IC chip 210, an LRA 202 and a host controller 205 configured to use the haptics driver IC chip 201 to drive the LRA 202 in a desired manner. In the example illustrated in FIG. 2, the LRA 202 is implemented in a multi-phase configuration, in which the LRA includes two or more coils, each of which are to be driven using respective instances of an analog driving signal $OUT_1(t)$, $OUT_2(t)$ that may be from each other. Note that the instances of the analog driving signal $OUT_1(t)$, $OUT_2(t)$ have characteristics similar to the ones of the analog driving signal $V_{drive}(t)$ produced by the haptics driver IC chip 110.

The haptics driver IC chip 210 includes two or more instances of an output driving port (e.g., like the output analog port $D_{OUT}$) to couple the haptics driver IC chip 210 with corresponding coils of the LRA 202. The haptics driver IC chip 210 includes two or more instances of class-D amplifier circuitry 230-1, 230-2 configured to provide, through respective instances of the output driving port to the corresponding coils of the LRA 202, respective instances of the analog driving signal $OUT_1(t)$, $OUT_2(t)$. For instance, the width of the pulses of the instances of the analog driving signal $OUT_1(t)$, $OUT_2(t)$ are modulated by respective modulations configured to control a position of the mass of the LRA 202 as a function of time, e.g., X(t), Z(t), $\Theta(t)$. As in the case of the class-D amplifier circuitry 130, each instance of the class-D amplifier circuitry 230-1 (230-2) includes a class-D modulator stage 232-1 (234-2) and a class-D power stage 234-1 (234-2). Here, each class-D modulator stage 232-1 (234-2) includes (i) PWM generating circuitry, (ii) short circuit protect circuitry coupled with the corresponding class-D power stage 234-1 (234-2), and (iii) gate driver circuitry coupled with each of the corresponding PWM generating circuitry, short circuit protect circuitry, and class-D power stage.

The haptics driver IC chip 210 further includes two or more instances of an input sensing port (e.g., like the input analog port $S_{IN}$) to couple the haptics driver IC chip 210 with corresponding position sensors of the LRA 202. Furthermore, the haptics driver IC chip 210 includes boost converter circuitry 236 and AFE circuitry 240 each coupled with the instances of the class-D amplifier circuitry. Furthermore, the haptics driver IC chip 210 includes a digital controller 220 coupled with each of the boost converter circuitry 236, the AFE circuitry 240 and each instance of the class-D amplifier circuitry 230-1, 230-2. Here, the digital controller 220 is a programmable digital controller that includes (i) boost-converter controller circuitry 228 coupled with the boost-converter circuitry 236, and (ii) a custom low-power (CLP) processor 222 coupled with each of the boost-converter controller circuitry, the AFE circuitry 240, and each instance of the class-D amplifier circuitry 230-1, 230-2. Here, the boost-converter controller circuitry 228 is programmable to execute an inductor estimation algorithm, a class H algorithm, a low-power mode algorithm, a current limit algorithm, and a boost-converter loop-control algorithm. The boost converter circuitry 236 can be implemented as the boost converter circuitry 136 described above in connection with FIGS. 1A-1B. In this example, the boost converter circuitry 236 can include respective ADCs to digitize a battery-monitoring signal $V_P(t)$ and a $V_{BST}$-monitoring signal $V_{BST}(t)$. The boost-converter controller circuitry 228 receives from the boost converter circuitry 236 the digitized versions of these signals $V_P[n]$, $V_{BST}[n]$ through a digital bus 229[$n$]. In turn, the boost-converter controller circuitry 228 transmits to the boost converter circuitry 236 a digital boost-control signal SW[n].

The AFE circuitry 240 can be implemented as the AFE circuitry 140 described above in connection with FIGS. 1A-1B. Here, the AFE circuitry 240 is configured to (i) receive, through an analog buffer 223, two or more instances of an analog drive-monitoring signal $V_{MON1}(t)$, $V_{MON2}(t)$, and two or more instances of an analog current-monitoring signal $I_{MON1}(t)$, $I_{MON2}(t)$ that have been measured at the corresponding instances of the output driving port, and (ii) digitize them to obtain corresponding digital signals $V_{MON1}[n]$, $V_{MON2}[n]$, $I_{MON1}[n]$, $I_{MON2}[n]$. Additionally, the AFE circuitry 240 is configured to (i) receive, through the corresponding instances of the input sensing port then through the analog buffer 223, two or more instances of an analog position-monitoring signal $POS_1(t)$, $POS_2(t)$ and two or more instances of an analog temperature-monitoring signal $Temp_1(t)$, $Temp_2(t)$ from corresponding position sensors of the LRA 202, and (ii) digitize them to obtain corresponding digital signals $POS_1[n]$, $POS_2[n]$, $Temp_1[n]$, $Temp_2[n]$. The AFE circuitry 240 transmits the digital signals $V_{MON1}[n]$, $V_{MON2}[n]$, $I_{MON1}[n]$, $I_{MON2}[n]$, $POS_1[n]$, $POS_2[n]$, $Temp_1[n]$, and $Temp_2[n]$ through a digital buffer 223 [n], to the CLP processor 222.

The CLP processor 222 receives, from the host controller 205 through one or more instances of an input digital port (e.g., like the input digital port $D_{IN}$), system control signals and target signals. The target signals can include a desired driving voltage signal $V_d[n]$, a desired driving current signal $I_d[n]$, desired position signal $X_d[n]$, desired velocity signal $\dot{I}_d[n]$, stored waveforms or real-time synthesis, etc. The CLP processor 222 transmits, to the host controller 205 through one or more instances of an output digital port, various monitoring signals, e.g., I/$V_{MON}$[n], POS[n], Temp[n], CL CMD, etc.

In some implementations, the CLP processor 222 can be configured as an ARM/DSP or as a programmable gate array. For example, the CLP processor 222 is programmable to execute CLP Software, which includes pass-through processes. As another example, the CLP processor 222 is programmable to execute haptics/MIMO closed-loop processes, such as a mixer algorithm, a VGA algorithm, a feedforward algorithm, a feedback algorithm, an LRA model, a thermal model, a Kalman filter, etc. By executing a combination of these algorithms in an appropriate manner, the CLP processor 222 can function as the class-D controller circuitry 124, or as the power controller circuitry 126, or both.

For instance, the CLP processor 222 is programmable to process at least (i) the instances of the digital sensor signals $POS_1$[n], $POS_2$[n], $Temp_1$[n], $Temp_2$[n], which correspond to the position, e.g., X(t), Z(t), Θ(t)), and temperature of the mass of the LRA 202, and (ii) the instances of the digital monitoring signals $V_{MON1}$[n], $V_{MON2}$[n], $I_{MON1}$[n], $I_{MON2}$[n] to produce two or more of instances of the digital driving signal $U_1$[n], $U_2$[n]. Note that the instances of the digital driving signal $U_1$[n], $U_2$[n] have characteristics similar to the ones of the digital driving signal U[n] produced by the CLP processor 122.

The CLP processor 222 transmits the instances of the digital driving signal $U_1$[n], $U_2$[n] through a digital buffer 221, to the respective instances of the class-D amplifier circuitry 230-1, 230-2. In this manner, each instance of the class-D amplifier circuitry 230-1 (230-2) suitably uses the respective instance of the digital driving signal $U_1$[n] ($U_2$[n]) to obtain the corresponding instance of the analog driving signal $OUT_1$(t) ($OUT_2$(t)).

Additionally, the CLP processor 222 is programmable to perform the process 150 for predicting a power budget for a haptics driver IC chip, as described above in connection with FIG. 1B. In this manner, the CLP processor 222 produces power control signals NG_$CL_1$[n], NG_$CL_2$[n], and weak_FET_$CL_1$[n] and weak_FET_$CL_2$[n] signals, and then transmits them, through a multi-path digital buffer 225[n], to the corresponding instances of class-D amplifier circuitry 230-1, 230-2.

A b-EMF voltage induced in the coil(s) of the LRA 102, 202 is proportional to the linear velocity of the LRA's mass, and thus can be used for sensing the motion of the mass. Conventionally, a b-EMF signal e is estimated based on the monitoring signals $V_{MON}$ and $I_{MON}$. For instance, the b-EMF signal can be calculated using the following formula:

$$V_{MON} = I_{MON} R_S + L_S \frac{dI_{MON}}{dt} + e, \quad (1)$$

where $R_S$ is the resistance and $L_S$ is the inductance of the LRA 102, 202's coils. However, the estimation accuracy of the b-EMF signal e is a function of the accuracy of the resistance estimation, and the latter can degrade quickly when the coil resistance changes, e.g., when the coils of the LRA 102, 202 heat up.

Figure 3:
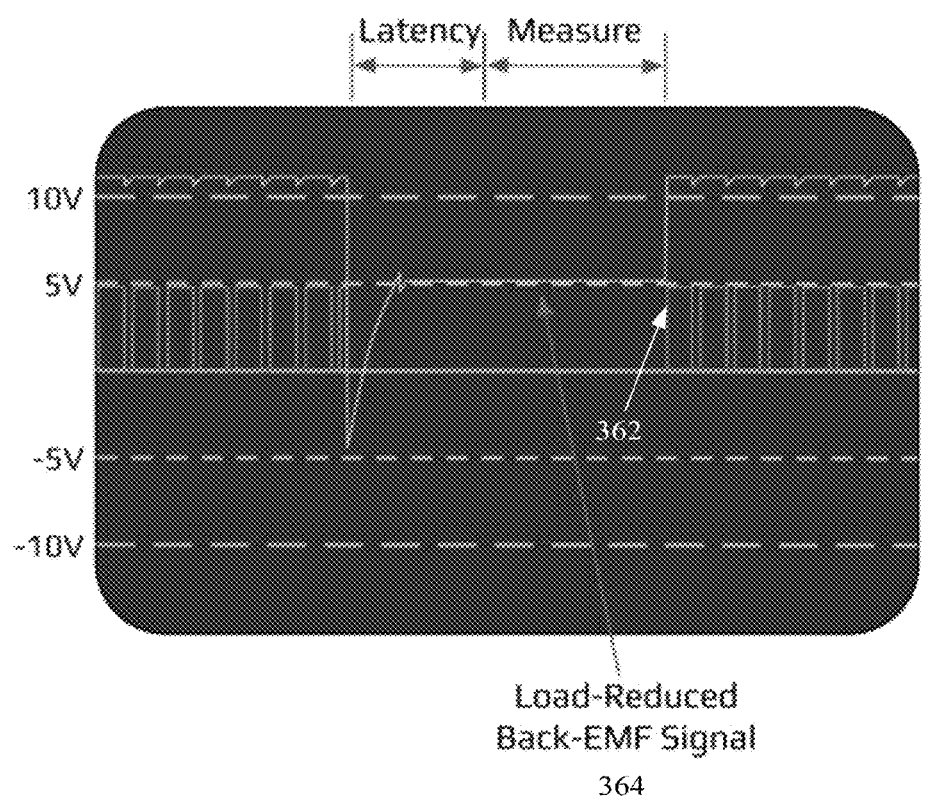
FIG. 3 shows a load-reduced b-EMF signal obtained by integrated mixed-signal chips for customized for haptics.

As illustrated in FIG. 3, the voltage $V_{MON}$ 364 across the LRA 102, 202 quickly converges to the b-EMF signal e during the OFF cycles of a PWM driving signal 362 when the switches of the class-D power stage(s) 134, 234 are open, i.e., when no current is allowed through the coils. Note that the PWM driving signal 362 corresponds to $V_{MON}$(t) or to $V_{MON1}$(t), $V_{MON2}$(t), for instance. The current stored in the coil still needs to be dissipated and the corresponding latency determines the minimum OFF-cycle duration of the PWM driving signal 362. The haptics driver IC chip 110, 210 can be used to switch to the b-EMF estimation during the OFF cycles of the PWM driving signal 362 by reducing the PWM frequency and allowing a minimum OFF-cycle duration. The proposed reducing of the PWM frequency can be implemented in the haptics driver IC chip 110, 210, because the PWM frequencies used for operating the disclosed haptics driver IC chips, e.g., less than 1000 Hz, are much smaller than audio frequencies used for operating audio amplifiers, e.g., 44.1 kHz or 48 kHz. Estimating the b-EMF signal e during OFF cycles of the PWM driving signal 362 enables elimination of the ADCs used for monitoring the current $I_{MON}$ of the LRA 102, 202.

Referring now to the haptics driver IC chip 110, the class-D controller circuitry 124 is programmable to obtain a b-EMF signal e[n] induced in the one or more coils of the LRA 102 as corresponding to OFF-cycle values of the digital drive-monitoring signal $V_{MON}$[n]. As such, the class-D controller circuitry 124 can estimate the velocity of the mass of the LRA 102 as a function of time $V_{est}$[n] based on the b-EMF signal e[n]. Moreover, as part of processing the digital position-monitoring signal $V_H$[n] and the digital drive-monitoring signal $V_{MON}$[n], the class-D controller circuitry 124 is programmable to estimate a position of the mass as a function of time, e.g., $X_{est}$[n], and then use at least the estimated mass position and the estimated mass velocity $V_{est}$[n] to obtain the digital driving signal U[n].

Referring now to the haptics driver IC chip 210, the CLP processor 222 is programmable to obtain a plurality of instances of the b-EMF signal, e.g., $e_1$[n], $e_2$[n], induced in respective coils of the LRA 202 as corresponding to OFF-cycle values of the respective instances of the digital drive-monitoring signal $V_{MON1}$[n], $V_{MON2}$[n]. As such, the CLP processor 222 can estimate the velocity of the mass of the LRA 202 as a function of time $V_{est}$[n] based on the instances of the b-EMF signal $e_1$[n], $e_2$[n]. In some implementations, as part of processing at least the instances of the digital sensor signals $POS_1$[n], $POS_2$[n], $Temp_1$[n], $Temp_2$[n] and the instances of the digital monitoring signals $V_{MON1}$[n], $V_{MON2}$[n], $I_{MON1}$[n], $I_{MON2}$[n], the CLP processor 222 estimates a position of the mass as a function of time, e.g., $X_{est}$[n], $Z_{est}$[n], $\Theta_{est}$[n], and then uses at least the estimated mass position and the estimated mass velocity $V_{est}$[n] to obtain the instances of the digital driving signal $U_1$[n], $U_2$[n]. Note that the CLP processor 222 estimates the digital driving signal $U_1$[n], $U_2$[n] in such a way that a test signal Test[n] follows the desired motion $X_d$[n].

Moreover, the haptics driver IC chip 210 can drive the first coil of the LRA 202, for which $I_{MON1}$≠0, and measure the b-EMF signal $e_2$[n] on the second coil of the LRA 202, for which $I_{MON2}$=0. Here, the first and second instances of the class-D amplifier circuitry 230-1, 230-2 are configured to provide respective first and second instances of the analog driving signal $OUT_1$(t), $OUT_2$(t) on a one-at-a-time basis. Further, the CLP processor 222 is programmable to obtain (i) a first instance of the b-EMF signal $e_1$[n] induced in the first coil of the LRA 202 when the first instance of the analog driving signal $OUT_1$(t) is not provided to the first coil, while the second instance of the analog driving signal $OUT_2$(t) is provided to the second coil of the LRA 202, and (ii) a second instance of the b-EMF signal $e_2$[n] induced in the second coil when the second instance of the analog driving signal OUT$_2$(t) is not provided to the second coil, while the first instance of the analog driving signal OUT$_1$(t) is provided to the first coil.

Figure 4:
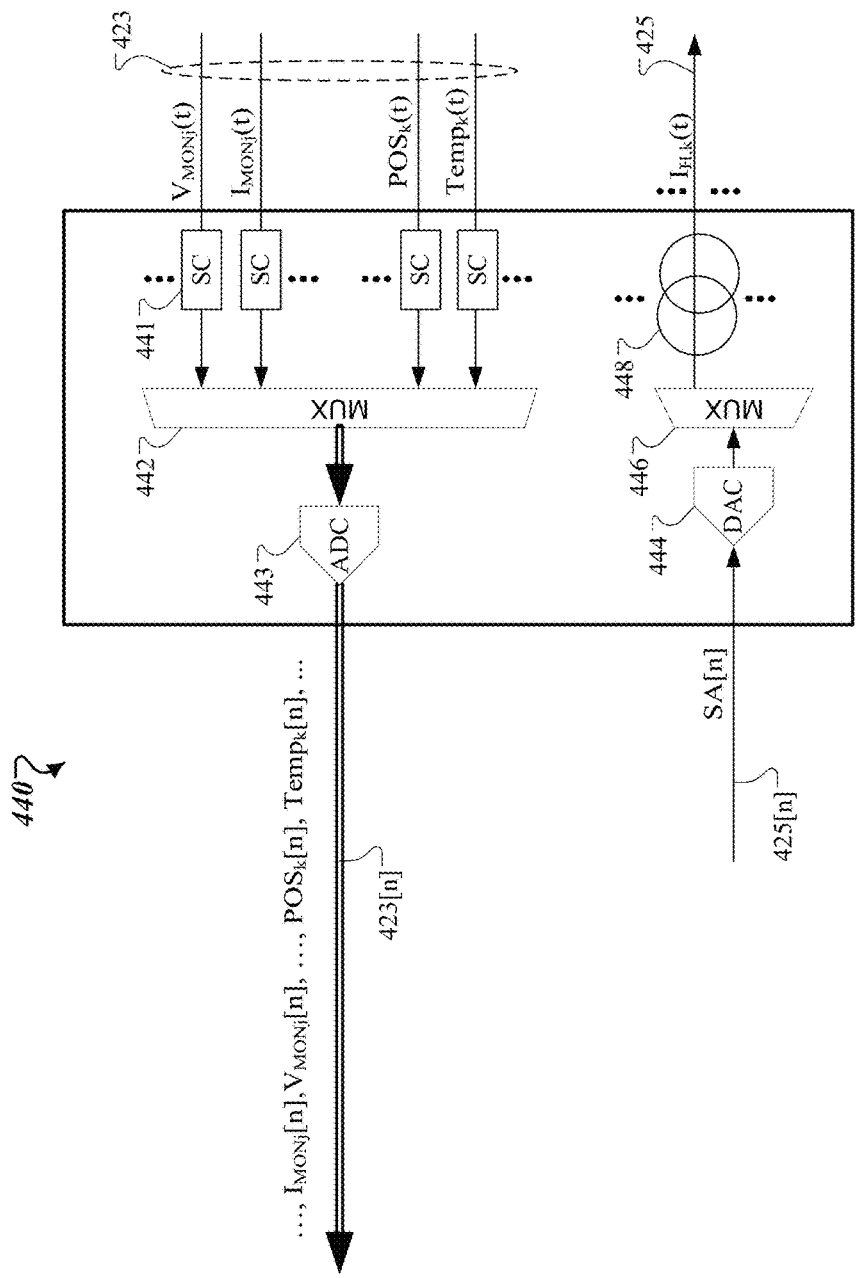
FIG. 4 shows aspects of AFE used by integrated mixed-signal chips customized for haptics.

FIG. 4 shows aspects of AFE circuitry 440 used by integrated mixed-signal chips customized for haptics. For example, the AFE circuitry 440 can be integrated in either of the haptics driver IC chips 110, 210.

In the example shown in FIG. 4, the AFE circuitry 440 includes a plurality of instances of signal conditioning circuitry 441 that receives, through an analog buffer 423, instances of an analog drive-monitoring signal V$_{MONj}$(t) and instances of an analog current-monitoring signal I$_{MONj}$(t) that have been measured at corresponding instances j of the output driving port, and instances of an analog position-monitoring signal POS$_k$(t) and instances of an analog temperature-monitoring signal Temp$_k$(t) from corresponding position sensors k of the LRA 202. Here, j is the port index (or coil index), j=1 ... N$_{portMAX}$, where N$_{portMAX}$ is the total number of driving ports of the haptics driver IC chip 110, 210 (or total number of coils of the LRA 102, 202); and k is the sensor index, k=1 ... N$_{sensorMAX}$, where N$_{sensorMAX}$ is the total number of sensors of the LRA 102, 202. Each instance of the signal conditioning circuitry 441 is configured to perform one or more of filtering, offsetting and pre-amplifying of each of the respective received analog signals.

The AFE circuitry 440 further includes multiplexer circuitry (MUX) 442 configured to multiplex the conditioned analog signals. Furthermore, the AFE circuitry 440 includes an ADC 443 to digitize the multiplexed analog signals. For instance, a unified ADC architecture, e.g., either Sigma-Delta or successive approximation register (SAR), can be used for I/V monitoring and position/temperature sensing. For example, all the measurements can be MUX-ed and handled by a SAR ADC at 12-16 bit accuracy. Not only the SAR ADC provides an adequate resolution for haptics applications, it also offers lower latency in comparison with Sigma-Delta ADC. Moreover, the ADC 443 transmits, through a digital buffer 423[n], the multiplexed digital signals V$_{MONj}$[n], I$_{MONj}$[n], POS$_k$[n], Temp$_k$[n] to the CLP processor 122, 222 of the haptics driver IC chips 110, 210.

Note that by integrating AFE circuitry corresponding to position sensing with the AFE circuitry of a haptics driver IC chip 110, 210, many redundant blocks of the chip can be removed. Additionally, because both UV monitoring and the magnetic field sensing are done by the same ADC path, as in the case of the AFE circuitry 440, perfect phase/delay matching can be achieved between the readouts.

Additionally, the AFE circuitry 440 further includes one or more instances of current source circuitry 448, each instance corresponding to a respective position sensor of the LRA 102, 202. Each instance of the current source circuitry 448 is configured to produce, or stop producing, an analog current signal I$_{H,k}$(t), so the one or more instances of the current source circuitry can selectively provide, through an analog bus 425 and respective output sensing ports (e.g., like the analog output port S$_{OUT}$), the analog current signal(s) to the respective one or more position sensors k of the LRA 102, 202. Here, k is the sensor index, k=1 ... N$_{sensorMAX}$, where N$_{sensorMAX}$ is the total number of position sensors of the LRA 102, 202. The AFE circuitry 440 further includes a digital-to-analog converter (DAC) 444 configured to receive, through a digital buffer 425[n] from the CLP processor 122, 222 of the haptics driver IC chips 110, 210, a digital sensor-activate signal SA[n] configured to active or deactivate the one or more of the instances current source circuitry 448. The DAC 444 is configured to produce an analog version SA(t) of the received digital sensor-activate signal. In cases when there is more than one instance of current source circuitry 448, the AFE circuitry 440 includes another MUX 446 configured to direct appropriate portions SA$_k$(t) of the analog sensor-activate signal to respective current sources k. In this manner, the CLP processor 122, 222 of the haptics driver IC chips 110, 210 can monitor incoming commands and act as a sensing current gate to turn off or on at least some of the position sensors of the LRA 102, 202.

In summary, a CL-controlled haptic engine architecture 100, 200 suitably closes the loop within the haptics driver IC chips 110, 210 in position/velocity-monitoring mode, at high bandwidth and low latency. Further, a CLP processor 122, 222 of the haptics driver IC chip 110, 210 can predict and control (by using class H or G algorithms) the boost converter circuitry 136, 236 and also the noise-gate. Furthermore, the haptics driver IC chip 110, 210 can measure b-EMF signals directly during OFF phases of the PWM driving signals. Moreover, the haptics driver IC chip 110, 210 is operated at LRA frequencies (also referred to as haptic frequencies) and not at audio frequencies. Additionally, the haptics driver IC chip 110, 210 can include driver/sense channels for estimating and actively cancelling higher modes of motion (e.g., when operated in MIMO/MultiPhase mode). Position-sensing AFE circuitry, e.g., including current sources, filters and ADCs, can be integrated with driving-monitoring AFE circuitry on haptics driver IC chip 110, 210, as well.

Figure 5:
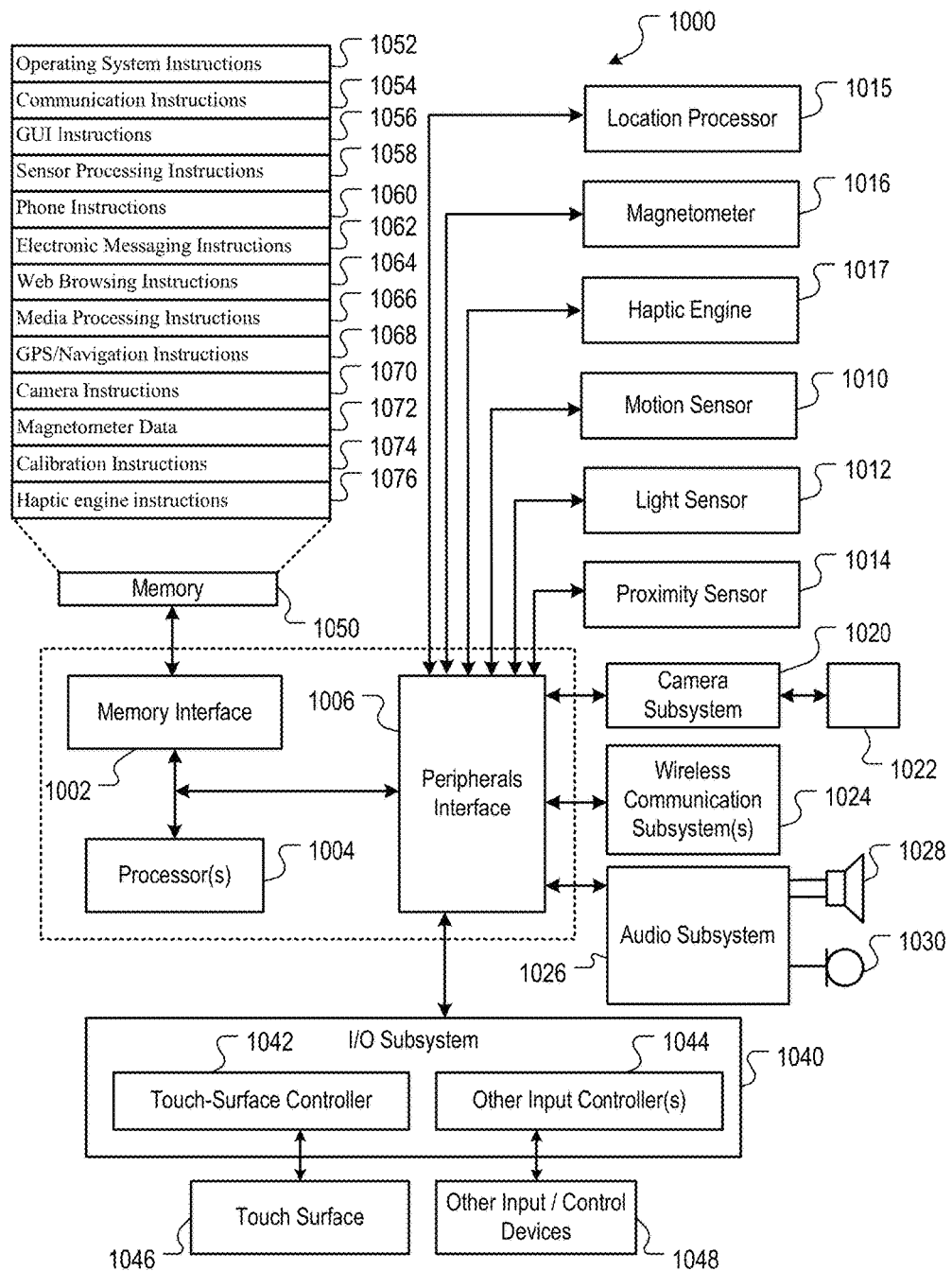
FIG. 5 shows aspects of a computing device that uses the disclosed integrated mixed-signal chip customized for haptics.

FIG. 5 is a diagram of an example of mobile device architecture that uses one of the haptic engines described in reference to FIGS. 1-4, according to an embodiment. Architecture 500 may be implemented in any mobile device for generating the features and processes described in reference to FIGS. 1-4, including but not limited to smart phones and wearable computers (e.g., smart watches, fitness bands). Architecture 500 may include memory interface 502, data processor(s), image processor(s) or central processing unit(s) 504, and peripherals interface 506. Memory interface 502, processor(s) 504 or peripherals interface 506 may be separate components or may be integrated in one or more integrated circuits. One or more communication buses or signal lines may couple the various components.

Sensors, devices, and subsystems may be coupled to peripherals interface 506 to facilitate multiple functionalities. For example, motion sensor(s) 510, light sensor 512, and proximity sensor 514 may be coupled to peripherals interface 506 to facilitate orientation, lighting, and proximity functions of the device. For example, in some embodiments, light sensor 512 may be utilized to facilitate adjusting the brightness of touch surface 546. In some embodiments, motion sensor(s) 510 (e.g., an accelerometer, rate gyroscope) may be utilized to detect movement and orientation of the device. Accordingly, display objects or media may be presented according to a detected orientation (e.g., portrait or landscape).

Haptic engine 517, under the control of haptic engine instructions 572, provides the features and performs the processes described in reference to FIGS. 1-4, such as, for example, implementing haptic feedback (e.g., vibration). Haptic engine 517 can include one or more actuators, such as piezoelectric transducers, electromechanical devices, and/or other vibration inducing devices, which are mechanically connected to an input surface (e.g., touch surface 546). Drive electronics (e.g., 110, 210) coupled to the one or more actuators cause the actuators to induce a vibratory response into the input surface, providing a tactile sensation to a user touching or holding the device.

Other sensors may also be connected to peripherals interface 506, such as a temperature sensor, a barometer, a biometric sensor, or other sensing device, to facilitate related functionalities. For example, a biometric sensor can detect fingerprints and monitor heart rate and other fitness parameters. In some implementations, a Hall sensing element in haptic engine 517 can be used as a temperature sensor.

Location processor 515 (e.g., GNSS receiver chip) may be connected to peripherals interface 506 to provide georeferencing. Electronic magnetometer 516 (e.g., an integrated circuit chip) may also be connected to peripherals interface 506 to provide data that may be used to determine the direction of magnetic North. Thus, electronic magnetometer 516 may be used to support an electronic compass application.

Camera subsystem 520 and an optical sensor 522, e.g., a charged coupled device (CCD) or a complementary metal-oxide semiconductor (CMOS) optical sensor, may be utilized to facilitate camera functions, such as recording photographs and video clips.

Communications functions may be facilitated through one or more communication subsystems 524. Communication subsystem(s) 524 may include one or more wireless communication subsystems. Wireless communication subsystems 524 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and embodiment of the communication subsystem 524 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 524 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 526 may be coupled to a speaker 528 and one or more microphones 530 to facilitate voice-enabled functions, such as voice recognition, voice replication, digital recording, and telephony functions. In an embodiment, audio subsystem includes a digital signal processor (DSP) that performs audio processing, such as implementing codecs.

I/O subsystem 540 may include touch controller 542 and/or other input controller(s) 544. Touch controller 542 may be coupled to a touch surface 546. Touch surface 546 and touch controller 542 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 546. In one embodiment, touch surface 546 may display virtual or soft buttons and a virtual keyboard, which may be used as an input/output device by the user.

Other input controller(s) 544 may be coupled to other input/control devices 548, such as one or more buttons, rocker switches, thumb-wheel, infrared port, USB port, and/or a pointer device such as a stylus. The one or more buttons (not shown) may include an up/down button for volume control of speaker 528 and/or microphone 530.

In some embodiments, device 500 may present recorded audio and/or video files, such as MP3, AAC, and MPEG video files. In some embodiments, device 500 may include the functionality of an MP3 player and may include a pin connector for tethering to other devices. Other input/output and control devices may be used.

Memory interface 502 may be coupled to memory 550. Memory 550 may include high-speed random access memory or non-volatile memory, such as one or more magnetic disk storage devices, one or more optical storage devices, or flash memory (e.g., NAND, NOR). Memory 550 may store operating system 552, such as Darwin, RTXC, LINUX, UNIX, OS X, iOS, WINDOWS, or an embedded operating system such as VxWorks. Operating system 552 may include instructions for handling basic system services and for performing hardware dependent tasks. In some embodiments, operating system 552 may include a kernel (e.g., UNIX kernel).

Memory 550 may also store communication instructions 554 to facilitate communicating with one or more additional devices, one or more computers or servers, including peer-to-peer communications. Communication instructions 554 may also be used to select an operational mode or communication medium for use by the device, based on a geographic location (obtained by the GPS/Navigation instructions 568) of the device.

Memory 550 may include graphical user interface instructions 556 to facilitate graphic user interface processing, including a touch model for interpreting touch inputs and gestures; sensor processing instructions 558 to facilitate sensor-related processing and functions; phone instructions 560 to facilitate phone-related processes and functions; electronic messaging instructions 562 to facilitate electronic-messaging related processes and functions; web browsing instructions 564 to facilitate web browsing-related processes and functions; media processing instructions 566 to facilitate media processing-related processes and functions; GNSS/Navigation instructions 568 to facilitate GNSS (e.g., GPS, GLOSSNAS) and navigation-related processes and functions; camera instructions 570 to facilitate camera-related processes and functions; and haptic engine instructions 572 for commanding or controlling haptic engine 517 and to provide the features and performing the processes described in reference to FIGS. 1-4.

Each of the above identified instructions and applications may correspond to a set of instructions for performing one or more functions described above. These instructions need not be implemented as separate software programs, procedures, or modules. Memory 550 may include additional instructions or fewer instructions. Furthermore, various functions of the device may be implemented in hardware and/or in software, including in one or more signal processing and/or application specific integrated circuits (ASICs). Software instructions may be in any suitable programming language, including but not limited to: Objective-C, SWIFT, C# and Java, etc.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. An integrated circuit (IC) chip for driving a mass of a linear resonant actuator using low-latency closed-loop control, the IC chip comprising:
   an output driving port to couple the IC circuit with one or more coils of the LRA;
   class-D amplifier circuitry configured to provide, through the output driving port to the one or more coils of the LRA, an analog driving signal, which has a pulse-width modulation configured to control a position of the mass as a function of time;
   an input sensing port to couple the IC circuit with one or more position sensors of the LRA; and
   class-D controller circuitry programmable to
      process at least (i) a digital position-monitoring signal relating to position-monitoring information, which is received through the input sensing port from the one or more position sensors of the LRA and corresponds to the mass position, and (ii) a digital drive-monitoring signal relating to the analog driving signal, to obtain a digital driving signal, and
      provide the digital driving signal to the class-D amplifier circuitry,
   wherein the class-D amplifier circuit is configured to amplify the digital driving signal to obtain the analog driving signal.

2. The IC chip of claim 1, wherein
   the analog driving signal has a frequency larger than 10 kHz and smaller than 100 kHz, and the pulse-width modulation has a haptic bandwidth, and
   the digital driving signal has a frequency that is smaller than the frequency of the analog driving signal.

3. The IC chip of claim 2, wherein the haptic bandwidth is smaller than 1000 Hz.

4. The IC chip of claim 1, comprising analog front-end (AFE) circuitry configured to
   receive an analog driving-monitoring signal that has been measured at the output driving port,
   digitize the analog driving-monitoring signal to obtain the digital driving-monitoring signal, and
   provide the digital driving-monitoring signal to the class-D controller circuitry.

5. The IC chip of claim 4, wherein the AFE circuitry is configured to
   provide an analog current signal to the one or more position sensors of the LRA,
   receive, through the input sensing port from the one or more position sensors of the LRA, an analog position-monitoring signal,
   digitize the analog position-monitoring signal to obtain the digital position-monitoring signal, and
   provide the digital position-monitoring signal to the class-D controller circuitry.

6. The IC chip of claim 4, wherein the AFE circuitry comprises
   signal conditioning circuitry configured to perform one or more of filtering, offsetting and pre-amplifying of each of the received analog signals, and
   at least one analog-to-digital converter (ADC) configured to perform the digitizing of the conditioned analog signals.

7. The IC chip of claim 6, wherein the ADC is a multi-channel sigma-delta ADC or a successive approximation register (SAR) ADC with MUX.

8. The IC chip of claim 1, wherein, as part of processing the at least the digital position-monitoring signal and the digital drive-monitoring signal, the class-D controller circuitry is programmable to
   estimate a position of the mass as a function of time, and then
   use at least the estimated mass position to obtain the digital driving signal.

9. The IC chip of claim 1, wherein the class-D controller circuitry is programmable to
   obtain a b-EMF signal induced in the one or more coils of the LRA as corresponding to off-cycle values of the digital drive-monitoring signal, and
   estimate a velocity of the mass as a function of time based on the b-EMF signal.

10. The IC chip of claim 9, wherein, as part of processing the at least the digital position-monitoring signal and the digital drive-monitoring signal, the class-D controller circuitry is programmable to
    estimate a position of the mass as a function of time, and then
    use at least the estimated mass position and the estimated mass velocity to obtain the digital driving signal.

11. The IC chip of claim 1, comprising
    (A) an input driving port to couple the IC circuit with a host controller;
    (B) a digital controller comprising
       (B.I) a programmable processor that comprises
          (B.I.a) the class-D controller circuitry, and
          (B.I.b) power controller circuitry that is different from the class-D controller circuitry and is programmable to
             (B.I.b.i) process at least the digital drive-monitoring signal and a digital desired-position signal, which is received through the input driving port from the host controller and represents a desired position of the mass, to obtain a digital desired-boost signal, and
             (B.I.b.ii) delay the digital desired-position signal, wherein the class-D controller circuitry is programmable to (B.I.a.i) process, along with the digital position-monitoring signal and the digital drive-monitoring signal, a delayed instance of the digital desired-position signal to obtain the digital driving signal, and (B.I.a.ii) provide the digital driving signal to a class-D modulator-stage of the class-D amplifier circuitry, (B.II) boost converter controller circuitry that is different from the digital controller and is configured to process at least the digital desired-boost signal to obtain a digital boost-control signal; and (C) boost converter circuitry configured to (C.i) obtain an analog boost signal based on the digital boost-control signal, and (C.ii) provide the analog boost signal to a class-D power-stage of the class-D amplifier circuitry.

12. The IC chip of claim 11, wherein the power controller circuitry is programmable to process at least the digital desired-position signal to obtain a digital noise gating signal, and provide the digital noise gating signal to the class-D power-stage.

13. The IC chip of claim 11, comprising (D) an output sensing port to couple the IC circuit with the one or more position sensors of the LRA; and wherein the power controller circuitry is programmable to process at least the digital desired-position signal to obtain a digital sensor-activate signal configured to cause the one or more position sensors of the LRA to transition from an active state to a passive state, or from the passive state to the active state.

14. The IC chip of claim 13, comprising analog front-end (AFE) circuitry, wherein the AFE circuitry comprises current source circuitry configured to produce, or stop producing, a current signal based on the digital sensor-activate signal, so the AFE circuitry can selectively provide, through the output sensing port the current signal to the one or more position sensors of the LRA.

15. A haptic system-in-package (SiP) comprising:
a printed-circuit board (PCB);
the IC chip of claim 11; and
the LRA, wherein each of the IC chip and the LRA is mounted on the PCB.

16. A haptic system comprising:
a printed-circuit board (PCB);
the IC chip of claim 11; and
the LRA comprising a frame, wherein the IC chip and the PCB are either encompassed by the frame or disposed externally to the frame.

17. A host device comprising:
the haptic system of claim 16; and
the host controller.

18. The host device of claim 17 is one of a smartphone, a tablet computer, a laptop computer, or a wearable device.

19. The IC chip of claim 1, wherein, to obtain the digital driving signal, the class-D controller circuitry is programmable to process, along with the digital position-monitoring signal and the digital drive-monitoring signal, (i) a digital current monitoring signal relating to an analog current signal, which is provided by the class-D amplifier circuitry through the output driving port to the one or more coils of the LRA, and (ii) a digital temperature-monitoring signal relating to temperature-monitoring information, which is received through the input sensing port from the one or more position sensors of the LRA and corresponds to a temperature of the respective sensor as a function of time.

20. The IC chip of claim 1, comprising:
a plurality of instances of the output driving port to couple the IC circuit with corresponding coils of the LRA;
a plurality of instances of the class-D amplifier circuitry configured to provide, through respective instances of the output driving port to the corresponding coils of the LRA, respective instances of the analog driving signal, which have respective instances of the pulse-width modulation configured to control the position of the mass as a function of time; and
a plurality of instances of the input sensing port to couple the IC circuit with corresponding position sensors of the LRA,
wherein the class-D controller circuitry is programmable to
process at least (i) the plurality of instances of the digital position-monitoring signal relating to position-monitoring information, which are received through the respective instances of the input sensing port from the corresponding position sensors of the LRA and correspond to the mass position, and (ii) the plurality of instances of the digital drive-monitoring signal relating to respective instances of the analog driving signal, to obtain a plurality of instances of the digital driving signal, and
provide the instances of the digital driving signal to the respective instances of the class-D amplifier circuitry,
wherein the instances of the class-D amplifier circuit are configured to amplify the respective instances of the digital driving signal to obtain the corresponding instances of the analog driving signal.

21. The IC chip of claim 20, wherein the AFE circuitry is configured to
receive a plurality of instances of the analog driving-monitoring signal that have been tapped from respective instances of the analog driving signal at the corresponding instances of the output driving port, and digitize them to obtain the respective instances of the digital driving-monitoring signal,
receive a plurality of instances of the analog position-monitoring signal through the corresponding instances of the input sensing port from the respective position sensors of the LRA, and digitize them to obtain the respective instances of the digital position-monitoring signal, and
provide the plurality of instances of the digital position-monitoring signal and the plurality of instances of the digital driving-monitoring signal to the class-D controller circuitry.

22. The IC chip of claim 21, wherein the AFE circuitry comprises
a plurality of instances of the signal conditioning circuitry, each instance corresponding to a respective received analog signal,
a multiplexer configured to multiplex the received analog signals, and
the ADC configured to perform the digitizing of the multiplexed analog signals.

23. The IC chip of claim 20, wherein the class-D controller circuitry is programmable to
obtain a plurality of instances of the b-EMF signal induced in respective coils of the LRA as corresponding to off-cycle values of the respective instances of the digital drive-monitoring signal, and
estimate the velocity of the mass as a function of time based on the instances of the b-EMF signal.

24. The IC chip of claim 23, wherein
first and second instances of the class-D amplifier circuitry are configured to provide respective first and second instances of the analog driving signal on a one-at-a-time basis, and
the class-D controller circuitry is programmable to obtain (i) a first instance of the b-EMF signal induced in the first coil when the first instance of the analog driving signal is not provided to the first coil while the second instance of the analog driving signal is provided to the second coil, and (ii) a second instance of the b-EMF signal induced in the second coil when the second instance of the analog driving signal is not provided to the second coil while the first instance of the analog driving signal is provided to the first coil.

25. The IC chip of claim 23, wherein, as part of processing at least the plurality of instances of the digital position-monitoring signal and the plurality of instances of the digital drive-monitoring signal, the class-D controller circuitry is programmable to
estimate a position of the mass as a function of time, and then
use at least the estimated mass position and the estimated mass velocity to obtain the plurality of instances of the digital driving signal.

26. The chip of claim 1, wherein the class-D controller circuitry and the power controller circuitry are configured as low power programmable processors, as programmable gate arrays or a combination of a low power programmable processor and a programmable gate array.

27. The chip of claim 1, wherein the class-D controller circuitry and the power controller circuitry comprise memory encoding instructions that, when executed by the class-D controller circuitry and/or the power controller circuitry, cause the class-D controller circuitry and/or the power controller circuitry to process the received digital signals using one or more of an LRA model, a thermal model and a Kalman filter.

* * * * *

UNITED STATES PATENT AND TRADEMARK OFFICE
CERTIFICATE OF CORRECTION

PATENT NO.         : 10,110,152 B1
APPLICATION NO.    : 15/721524
DATED              : October 23, 2018
INVENTOR(S)        : Arman Hajati Page 1 of 1

It is certified that error appears in the above-identified patent and that said Letters Patent is hereby corrected as shown below:

In the Claims

Column 21, Line 47, In Claim 16, delete "11;" and insert -- 11 mounted on the PCB --.

Signed and Sealed this
Seventeenth Day of March, 2020

Andrei Iancu
*Director of the United States Patent and Trademark Office*